(12) United States Patent
Hayat et al.

(10) Patent No.: US 10,128,398 B1
(45) Date of Patent: Nov. 13, 2018

(54) RESONANCE AVALANCHE PHOTODIODES FOR DYNAMIC BIASING

(71) Applicant: STC.UNM, Albuquerque, NM (US)

(72) Inventors: Majeed M. Hayat, Albuquerque, NM (US); Payman Zarkesh-Ha, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 259 days.

(21) Appl. No.: 14/720,249

(22) Filed: May 22, 2015

Related U.S. Application Data

(60) Provisional application No. 62/002,352, filed on May 23, 2014.

(51) Int. Cl.
*H03F 3/08* (2006.01)
*H01L 31/107* (2006.01)
*H01L 25/16* (2006.01)

(52) U.S. Cl.
CPC .......... *H01L 31/107* (2013.01); *H01L 25/167* (2013.01); *H03F 3/08* (2013.01)

(58) Field of Classification Search
CPC . H01L 31/107; H01L 31/1075; H01L 25/167; G02B 6/0018; G02B 6/0028; G02B 6/0076; H03F 3/08
USPC .............................. 250/214 A, 214 R, 214 L
See application file for complete search history.

(56) References Cited

U.S. PATENT DOCUMENTS

| | | | |
|---|---|---|---|
| 4,963,727 A | 10/1990 | Cova | |
| 5,371,354 A * | 12/1994 | Domon | H04B 10/6973 250/214 R |
| 5,525,954 A * | 6/1996 | Komazaki | H01P 7/084 333/219 |
| 5,721,424 A | 2/1998 | Price | |
| 6,043,480 A | 3/2000 | Sakamoto et al. | |
| 6,218,657 B1 | 4/2001 | Bethune et al. | |
| 7,271,405 B2 | 9/2007 | Krishna et al. | |

(Continued)

FOREIGN PATENT DOCUMENTS

| | | |
|---|---|---|
| CN | 1124654 C | 10/2003 |
| CN | 1225194 A | 10/2003 |
| JP | 2013042365 A * | 2/2013 |

OTHER PUBLICATIONS

"U.S. Appl. No. 13/289,645, Final Office Action dated Dec. 3, 2015", 7 pgs.

(Continued)

*Primary Examiner* — Thanh Luu
*Assistant Examiner* — Kevin Wyatt
(74) *Attorney, Agent, or Firm* — Schwegman Lundberg & Woessner, P.A.

(57) ABSTRACT

Systems and methods implementing a resonance circuit, including an avalanche photodiode, in which a resonance frequency of the resonance circuit is matched with the frequency of a dynamic biasing signal of the avalanche photodiode, can be used in a variety of applications. In various embodiments, a method for blocking and/or compensating current injection associated with the parasitic capacitance of APDs operated under dynamic biasing may be substantially realized by the matching of the resonance frequency of a resonance circuit including the avalanche photodiode with the frequency of an applied dynamic biasing signal. Additional systems and methods are described that can be used in a variety of applications.

24 Claims, 11 Drawing Sheets

(56) References Cited

U.S. PATENT DOCUMENTS

| | | | |
|---|---|---|---|
| 9,269,845 B2 | 2/2016 | Williams et al. | |
| 9,354,113 B1 | 5/2016 | Hayat et al. | |
| 9,553,216 B2 | 1/2017 | Williams et al. | |
| 9,759,602 B2 | 9/2017 | Williams et al. | |
| 2002/0032014 A1* | 3/2002 | Gogolla | H03D 9/00 455/196.1 |
| 2003/0160596 A1* | 8/2003 | Alexander | H02M 1/44 323/235 |
| 2005/0222814 A1 | 10/2005 | Nicholls et al. | |
| 2005/0286910 A1 | 12/2005 | Wernlund et al. | |
| 2006/0038638 A1* | 2/2006 | Shinabe | H01P 1/20345 333/204 |
| 2008/0017785 A1* | 1/2008 | Byren | H04B 10/6911 250/214 R |
| 2010/0277255 A1* | 11/2010 | Matsushita | H03H 7/0123 333/175 |
| 2011/0133059 A1* | 6/2011 | Kim | G01J 1/46 250/214 R |
| 2011/0233385 A1* | 9/2011 | Dyer | H01L 31/02027 250/214 R |
| 2012/0168612 A1 | 7/2012 | Kardynal et al. | |
| 2013/0194000 A1* | 8/2013 | Zhang | H03K 17/16 326/30 |
| 2016/0254867 A1 | 9/2016 | Hayat et al. | |
| 2017/0199078 A1* | 7/2017 | Huang | G01J 1/44 |
| 2017/0328768 A1 | 11/2017 | Williams | |

OTHER PUBLICATIONS

"U.S. Appl. No. 13/289,645, Non Final Office Action dated May 22, 2015", 10 pgs.

"U.S. Appl. No. 13/289,645, Notice of Allowance dated Feb. 1, 2016", 8 pgs.

"U.S. Appl. No. 13/289,645, Response filed Jan. 13, 2016 to Final Office Action dated Dec. 3, 2015", 8 pgs.

"U.S. Appl. No. 13/289,645, Response filed May 11, 2015 to Restriction Requirement dated Mar. 12, 2015", 15 pgs.

"U.S. Appl. No. 13/289,645, Response filed Aug. 21, 2015 to Office Action dated May 22, 2015", 10 pgs.

"U.S. Appl. No. 13/289,645, Restriction Requirement dated Mar. 12, 2015", 7 pgs.

"New Focus Internet Home Page", [online]. [archived on Feb. 2, 2010]. Retrieved from the Internet: <https://web.archive.org/web/20100202032807/http://www.newfocus.com/>, (Feb. 2, 2010), 1 pg.

Attaluri, R. S., et al., "Effects of Si doping on normal incidence in AS/In 0.15 Ga 0.85 As dots-in-well quantum dot infrared photodetectors", Journal of Applied Physics, 99, 083105, (2006), 1-3.

Attaluri, R. S., "Resonant cavity enhanced in As/In 0.15 Ga 0.85 As dots-in-a-well quantum dot infrared photodetector", Journal of Vacuum Science & Technology B, 25, (2007), 1186-1190.

Campbell, J. C., et al., "High-Speed, Low-Noise Avalanche Photodiodes", Optical Fiber Communications Conference (OFC 2000), (2000), 114-116.

Campbell, Joe C., et al., "Recent Advances in Avalanche Photodiodes", IEEE Journal of Selected Topics in Quantum Electronics, 10(4), (2004), 777-787.

Choi, Byonghyok, et al., "Computation of Bit-Error Probabilities for Optical Receivers using Thin Avalanche Photodiodes", IEEE Communications Letters, 10(1), (Jan. 2006), 56-58.

Cook, L. W., et al., "Electron and hole impact ionization coefficients in InP determined by photomultiplication measurements", Applied Physics Letters, 40(7), (1982), 589-591.

Cova, S., et al., "Active-Quenching and Gating Circuits for Single-Photon Avalanche Diodes (SPADs)", IEEE Transactions on Nuclear Science, vol, NS-29, No. 1, (Feb. 1982), 599-601.

Cova, S., et al., "Avalanche photodiodes and quenching circuits for single-photon detection", Applied Optics, 35(12), (1996), 1956-1976.

David, J. P. R., et al., "Material Considerations for Avalanche Photodiodes", IEEE Journal of Selected Topics in Quantum Electronics, 14(4), (2008), 998-1009.

Dente, Gregory C., et al., "Pseudopotential methods for superlattices: Applications to mid-infrared semiconductor", Journal of Applied Physics, 86(3), (1999), 1420-1429.

Gnauch, A. H., et al., "2.5 and 10 Gb/s Transmission Experiments Using a 137 Photon/Bit Erbium-Fiber Preamplifier Receiver", IEEE Photonics Technology Letters, 4(1), (Jan. 1992), 80-82.

Goh, Y. L., et al., "Excess Avalanche Noise in In0.52Al0.48As", IEEE Journal of Quantum Electronics, 43(6), (Jun. 2007), 503-507.

Goh, Y. L., et al., "Excess Noise and Avalanche Multiplication in InAlAs", Proceedings of IEEE Laser and Electro Optics Society, LEOS, (2006), 787-788.

Gunapala, S. D., et al., "640×512 pixels Long-Wavelength Infrared (LWIR) Quantum Dot Infrared Photodetector (QDIP) imaging focal plane array", Sensors, Systems, and Next-Generation Satellites X, Proc. of SPIE—vol. 6361, (2006), 1-3.

Gunapala, S. D., et al., "Demonstration of 640×512 Pixels Long-Wavelength Infrared (LWIR) Quantum Dot Infrared Photodetector (QDIP) Focal Plane Arrary", Quantum Sensing and Nanophotonic Devices IV, Proceedings of SPIE—vol. 6479, (2007), 9 pgs.

Gunapala, S., et al., "Demonstration of 640×512 pixels long-wavelength infrared (LWIR) quantum dot infrared photodetector (QDIP) imaging focal plane array", Infrared Physics & Technology, 50(2-3), (2007), 149-155.

Gunapala, S. D., et al., "Long-Wavelength Infrared (LWIR) Quantum Dot Infrared Photodetector (QDIP) Focal Plane Array", Infrared Technology and Applications XXXII, Proceedings of SPIE, vol. 6206, (2006), 1-10.

Gunapala, Sarah D., et al., "640×512 Pixels Long-Wavelength Infrared (LWIR) Quan—Dot Infrared Photodetector (QDIP) Imaging Focal Plane Array", IEE Journal of Quantum Electronics, 43(3), (Mar. 2007), 230-237.

Hayat, M. M., et al., "Boundary Effects on Multiplication Noise in Thin Heterostructure Avalanche Photodiodes: Theory and Experiment", IEEE Transactions on Electron Devices, 49(12), (Dec. 2002), 2114-2123.

Hayat, Majeed M., et al., "A New Approach for Computing the Bandwidth Statistics of Avalanche Products", IEEE Transactions on Electron Devices, 47(6), (2000), 1273-1279.

Hayat, Majeed M., et al., "Effect of Dead Space on Gain and Noise in Si and GaAs Avalanche Photodiodes", IEEE Journal of Quantum Electronics, 28(5), (1992), 1360-1365.

Hayat, Majeed M., et al., "Effect of Dead Space on Gain and Noise of Double-Carrier-Multiplication Avalanche Photodiodes", IEEE Transactions on Electron Devices, 39(3), (1992), 546-552.

Hayat, Majeed M., et al., "Gain-Bandwidth Characteristics of Thin Avalanche Photodiodes", IEEE Transactions on Electron Devices, 49(5), (May 2002), 770-781.

Hayat, Majeed M., et al., "High Speed Heterostructure Avalanche Photodiodes", Active and Passive Optical Components for WDM Communications III, Proceedings of the SPIE—vol. 5246, (2003), 400-408.

Hayat, Majeed M., "Statistical Properties of the Impulse Response Function of Double Carrier Multiplication Avalanche Photodiodes Including the Effect of Dead Space", IEEE J. . Lightwave Technol., 10(10), (1992), 1415-1425.

Helinski, Ryan, et al., "A Linear Digital VCO for Clock Data Recovery (CDR) Applications", IEEE International Conference on Electronics (ICECS 2010), (2010), 98-101.

Kagawa, Toshiaki et al., "An InGaAs/InAlAs Superlattice Avalanche Photodiode with a Gain Bandwidth Product of 90 GHz", IEEE Photonics Technology Letters, 3(9), (1991), 815-817.

Kang, Yimin, et al., "Monolithic germanium/silicon avalanche photodiodes with 340 GHz gain-bandwidth", Nature Photonics, vol. 3, (Jan. 2009), 59-63.

Kasper, Bryon L., et al., "Multigigabit-per-Second Avalanche Photodiode Lightwave Receivers", Journal of Lightwave Technology, vol. LT-5, No. 10, (1987), 1351-1364.

Kinsey, G. S., et al., "High-Speed Waveguide Avalanche Photodetectors", Proceedings IEEE Device Research Conference, (2001), 149-150.

(56) References Cited

OTHER PUBLICATIONS

Kinsey, G. S., et al., "Waveguide Avalanche Photodiode Operating at 1.55 um with a Gain-Bandwidth Product of 320 GHz", IEEE Photonics Technology Letters, 13(8), (2001), 842-844.
Krishna, Sanjay, et al., "Quantum Dot Based Infrared Focal Plane Arrays", Proceedings of the IEEE, 95(9), (Sep. 2007), 1838-1852.
Kwon, Ohhyun, "Modeling and Optimization of Heterojunction Avalanche Photodiodes: Noise, Speed and Breakdown", (Abstract), Thesis, PhD., Dissertation, University of New Mexico, (Dec. 2004), 9 pgs.
Kwon, Oh-Hyun, et al., "Enhanced Gain-Bandwidth Product and Performance in Thin Heterostructure Avalanche Photodiodes", Proceedings of the IEEE Lasers and Electro-Optics Society (LEOS) Annual Meeting, (2003), 997-998.
Kwon, Oh-Hyun, et al., "Gain-Bandwidth Product Optimization of Heterostructure Avalanche Photodiodes", Journal of Lightwave Technology, 23(5), (May 2005), 1896-1906.
Lee, S. C., et al, "Light coupling through a plasmonic antenna integrated on an InAs/GaAs quantum dot infrared photodetector", 19th Annual Meeting of the IEEE Lasers and Electro-Optics Society, (LEOS 2006), (2006), 250-251.
Makita, Kikuo, et al., "40Gbps Waveguide Photodiodes", NEC J. of Adv. Tech., (2005), 234-240.
Nakata, T., et al,, "InAlAs avalanche photodiodes with very thin multiplication layer of 0.1.um for high-speed and low-voltage-operation optical receiver", Electronics Letters, 36(21), (2000), 1807-1809.
Nakata, Takeshi, et al., "Multiplication Noise Characterization of InAlAs-APD With Heterojunction", IEEE Photonics Technology Letters, 21(24), (2009), 1852-1854.
Ng J. S., et al., "Effect of Dead Space on Avalanche Speed", IEEE Transactions on Electronic Devices, 49(4), (Apr. 2002), 544-549.
Ng, J. S., et al., "Effect of Impact Ionization in the InGaAs Absorber on Excess Noise of Avalanche Photodiodes", IEEE Journal of Quantum Electronics, 41(8), (Aug. 2005), 1092-1096.
Ng, J. S., et al., "Field Dependence of Impact Ionization Coefficients in In0.53Ga0.47As", IEEE Transactions on Electron Devices, 50(4), (Apr. 2003), 901-905.
Ong, Daniel S. G., et al., "Optimization of InP APDs for High Speed Lightwave Systems", Journal of Lightwave Technology, 27(15), (2009), 3294-3302.
Osaka, Fukunobu, et al., "Electron and hole ionization coefficients in (100) oriented Ga0.18In0.18In0.82As0.39P0.61", Appl. Phy. Lett., 45(6), (1984), 654-656.
Osaka, Fukunobu, et al., "Electron and hole ionization coefficients in (100) oriented Ga0.33In0.67As0.70P0.30", Applied Physics Letters, 45, (1984), 292-293.
Plimmer, S. A., et al., "Impact ionization probabilities as functions of two-dimensional space and time", Journal of Applied Physics, 89(5), (2001), 2742-2751.
Saleh, Mohammad A., et al., "Dead-Space-Based Theory Correctly Predicts Excess Noise Factor for Thin GaAs and AlGaAs Avalanche Photodiodes", IEEE Transactions on Electron Devices, 47(3), (Mar. 2000), 625-633.
Saleh, Mohammad A., et al., "Impact-Ionization and Noise Characteristics of thin III-V Avalanche Photodiodes", IEEE Transactions on Electron Devices, 48(12), (Dec. 2001), 2722-2731.

Shao, Jiayi, et al., "Demonstration of a Novel Mid Infrared Device: The Quantum-Dot Avalanche Photodiode (QDAP)", 2006 IEEE LEOS Annual Meeting Conference Proceedings, (2006), 114-115.
Shimizu, S. et al., "40 Gbit/s waveguide avalanche photodiode with p-type absorption layer and thin InAlAs multiplication layer". Electronics Letters, 43(8), (2007), 476-477.
Srinivasan, Kartik, et al., "Single quantum dot spectroscopy using a fiber taper waveguide near-field optic", Applied Physics Letters, 91, 091102, (2007), 1-3.
Sun, P., "Correlation Between Gain and Buildup-Time Fluctuations in Ultrafast Avalanche Photodiodes and Its Effect on Receiver Sensitivity", Optical Fiber Communication Conference, 2005. Technical Digest. OFC/NFOEC, (2005), 3 pgs.
Sun, Peng, "A Linear Equalizer for High-Speed APD-Based Integrate-and-Dump Receivers", IEEE Communications Letters, 9(12), (Dec. 2005), 1073-1075.
Sun, Peng, et al., "Decision-Feedback and Transversal Equalization for High-Speed APD-Based Receivers", SPIE Symposium on Optics East, Optoelectronic Devices: Physics, Fabrication, and Application III, (2006), 1-3.
Sun, Peng, "Mathematical Theory of Modern Avalanche Photodiodes and Its Application to Ultrafast Communications", Thesis, PhD., Dissertation. University of New Mexico, (May 2008), 111 pgs.
Sun, Peng, et al., "Statistical Correlation of Gain and Buildup Time in APDs and Its Effects on Receiver Performance", Journal of Lightwave Technology, 24(2), (2006), 755-768.
Tan, C. H., et al., "Potential Materials for Avalanche Photodiodes Operating above 10Gb/s", 2009 International Conference on Computers and Devices for Communication, (2009), 1-6.
Tan, C. H., et al., "The effect of dead space on gain and excess noise in In0.38Ga0.52P p+in+diodes", Semicond. Sci. Technol., 18, (2003), 803-806.
Varley, E., et al., "Single bump, two-color quantum dot camera", Applied Physics Letters, 91, 081120, (2007), 1-3.
Wang, S., et al., "Low-Noise Avalanche Photodiodes With Graded Impact-Ionization-Engineered Multiplication Region", IEEE Photonics Technology Letters, 13(12), (Dec. 2001), 1346-1348.
Wang, S., et al., "Low-Noise Impact-Ionization-Engineered Avalanche Photodiodes Grown on InP Substrates", IEEE Photonics Technology Letters, 14(12), (Dec. 2002), 1722-1724.
Wang, Shuling, et al., "Ultra-Low Nosie Avalanche Photodiodes With a "Centered-Wall" Multiplication Region", IEEE Journal of Quantum Electronics, 39(2), (Feb. 2003), 375-378.
Yasuoka, Nami, et al., "Large Multiplication-Bandwidth Products in APDs with a Thin InP Multiplication Layer", The 16th Annual Meeting of the IEEE Lasers and Electro-Optics Society, (LEOS 2003), (2003), 999-1000.
Yuan, P., et al., "Avalanche Photodiodes with an Impact-Ionization-Engineered Multiplication Region", IEEE Photonics Technology Letters, 12(10), (Oct. 2000), 1370-1372.
Zaoui, Wissem S., et al., "Frequency response and bandwidth enhancement in Ge/Si avalanche photodiodes with over 840GHz gain-bandwidth-product", Optics Express, 17(15), (2009), 12641-12649.
Zhiwen, Lu, et al., "Single Photon Detection with Sine Gated Dual InGaAs/InP Avalanche Diodes", Photonics Conference (IPC). IEEE, (Sep. 2012), 98-99.

* cited by examiner

RESONANCE AVALANCHE PHOTODIODES FOR DYNAMIC BIASING

RELATED APPLICATION

This application claims priority under 35 U.S.C. 119(e) from U.S. Provisional Application Ser. No. 62/002,352, filed 23 May 2014, which application is incorporated herein by reference in its entirety.

FIELD OF THE INVENTION

The invention relates generally to electronic structures and devices.

BACKGROUND

Avalanche photodiodes (APDs) are important components in low-cost optical receivers. However, due to their long buildup time, current APDs typically are not able to meet the requirements for high bit-rate telecom systems. Currently, there appears to be no commercially available telecommunications APDs that can operate at the rate of 40 Gbps. A dynamic biasing method has been shown to be a novel solution that potentially improves the speed and sensitivity of APDs needed for 40 GB/S light-wave systems and beyond. Dynamic biasing of an APD is a non-constant bias of the APD.

A difficulty in implementing dynamic biasing APDs is their parasitic capacitance that causes a dynamic-bias signal to be injected into the optical current generated by the APD. See FIG. 1, where FIG. 1 is a schematic representation of a standard APD 105 with parasitic capacitance 110. At high frequencies the injected bias current, which is unwanted and hence noise, can be orders of magnitude larger than the optical current (signal) and overwhelms it completely. This issue can be referred to as the current-injection problem associated with the dynamic biasing of APDs.

There are few existing techniques that have been suggested to address the issue of current-injection problem in dynamic biasing APDs. These include the use of a notch filter to eliminate the injected bias noise as shown in FIG. 2. FIG. 2 is a schematic representation of an APD 205 arranged in a dynamic biasing arrangement with APD 205 coupled to a notch filter 215. Notch filter 215 can provide a voltage output in response to an optical signal incident on APD 205. However, since the frequency of the dynamic bias is the same as the frequency of the optical signal (bit rate), the notch filter will degrade the quality of the signal.

Another technique includes the use of a dummy APD and differential signaling technique to eliminate the dynamic bias that appears as a common-mode signal, as shown in FIG. 3. FIG. 3 is a schematic representation of an APD 305 arranged in a differential signaling technique with a dummy APD 320 using a transimpedance amplifier 315. A dynamic bias generator 330 can provide a drive signal to a radio frequency (RF) differential amplifier 325 that is coupled to both APD 305 and dummy APD 320. APD 305 can be coupled to dummy APD 320 at an input to transimpedance amplifier 315, where transimpedance amplifier 315 can provide a voltage output in response to an optical signal incident on APD 305. Although the technique of FIG. 3 is a preferred choice over the notch filtering approach of FIG. 2, a differential amplifier with a good common-mode-rejection-ratio (CMRR) will be required.

Another technique includes the use of a dummy APD with differential biasing technique to address the issue, as shown in FIG. 4. FIG. 4 is a schematic representation of an APD 405 arranged in a differential biasing technique with a dummy APD 420 using a RF differential amplifier 415. APD 405 and dummy APD 420 can be coupled to the same bias sources with APD 405 coupled to an input to RF differential amplifier 415 and dummy APD 420 coupled to another input to RF differential amplifier 415. In this arrangement, transimpedance amplifier 315 can provide a voltage output in response to an optical signal incident on APD 305. Transimpedance amplifier 315 may provide a CMMR of 80 dB. However, creating perfectly aligned differential biasing signals at high frequency is normally difficult to create. Moreover, there will still be a large injected bias current that will be dissipated through the parasitic capacitances of APDs.

BRIEF DESCRIPTION OF THE DRAWINGS

Embodiments of the invention are illustrated by way of example and not limitation in the figures of the accompanying drawings in which.

DETAILED DESCRIPTION

The following detailed description refers to the accompanying drawings that show, by way of illustration and not limitation, various example embodiments of the invention. These embodiments are described in sufficient detail to enable those skilled in the art to practice these and other embodiments. In order to avoid obscuring embodiments of the invention, some well-known system configurations and process steps are not disclosed in detail. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
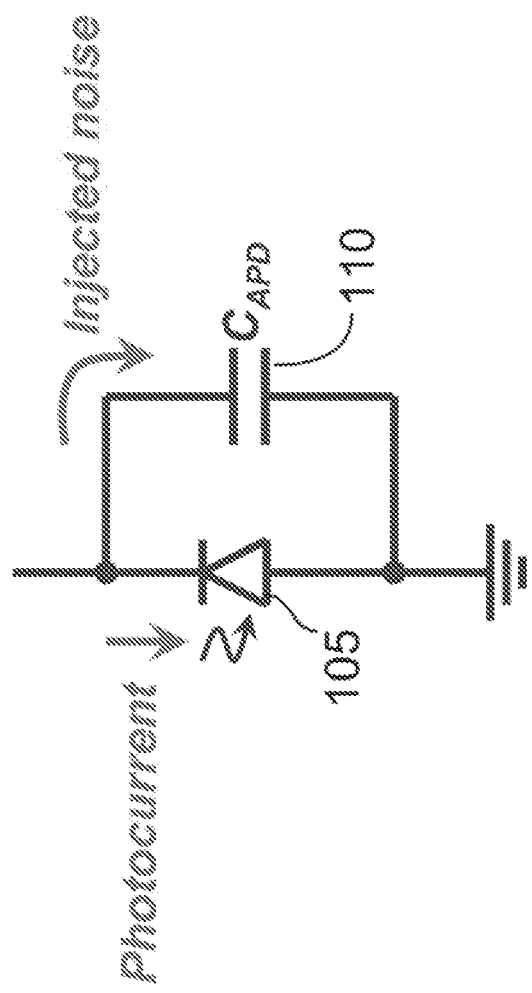
FIG. 1 is a schematic representation of a standard avalanche photodiode with parasitic capacitance.
Figure 2:
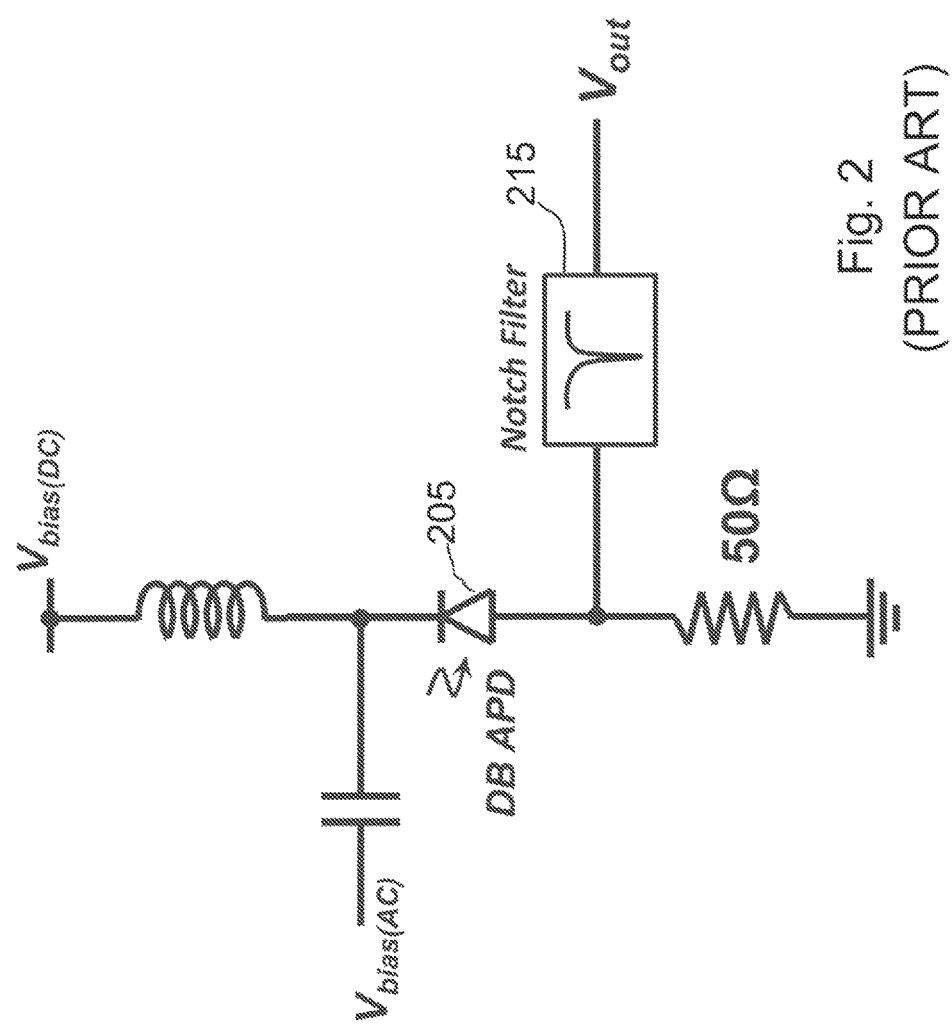
FIG. 2 is a schematic representation of a standard avalanche photodiode arranged in a dynamic biasing arrangement with the avalanche photodiode coupled to a notch filter.
Figure 3:
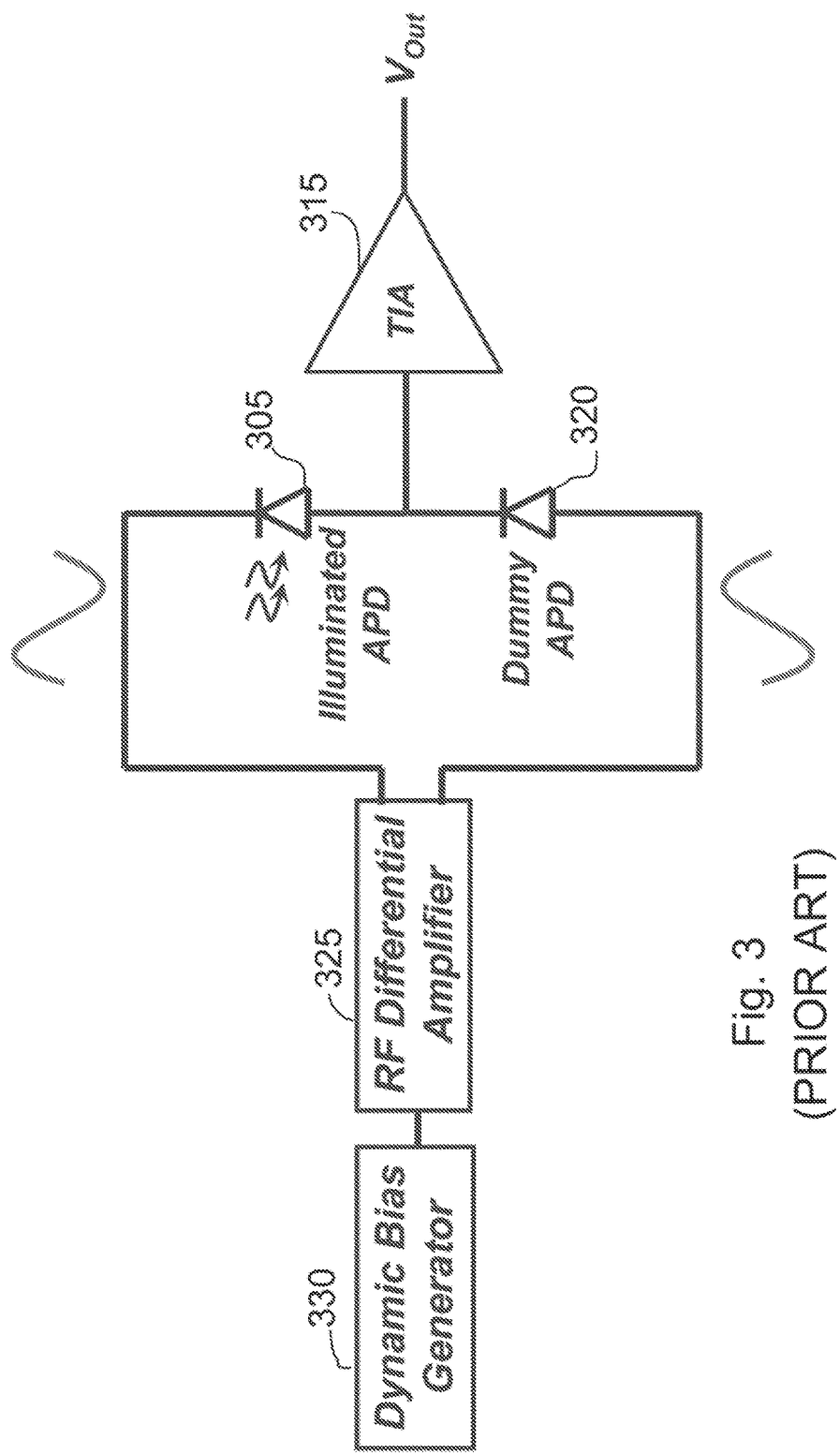
FIG. 3 is a schematic representation of a standard avalanche photodiode arranged in a differential signaling technique with a dummy avalanche photodiode using a transimpedance amplifier.
Figure 4:
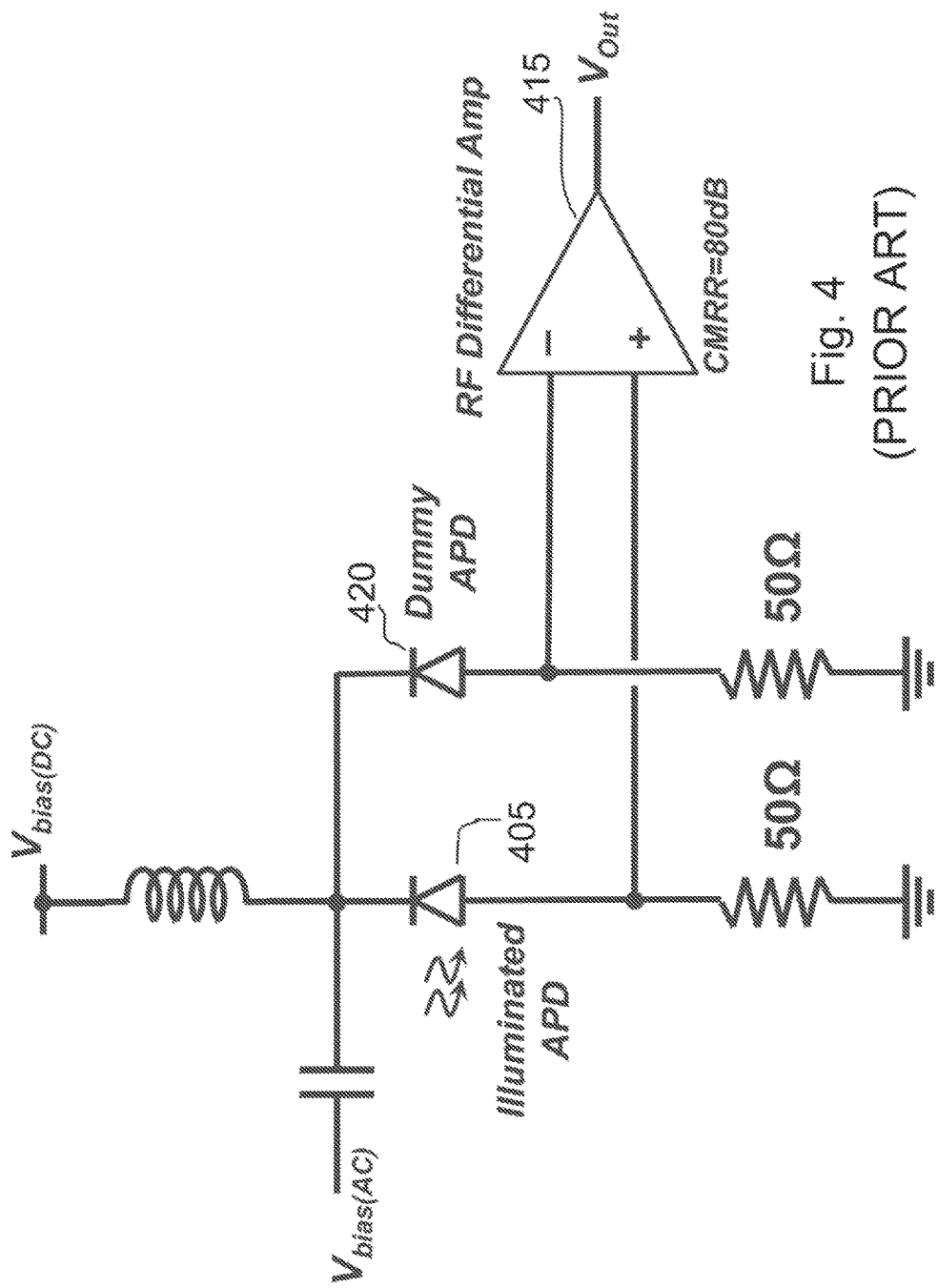
FIG. 4 is a schematic representation of a standard avalanche photodiode arranged in a differential biasing technique with a dummy avalanche photodiode using a radio frequency differential amplifier.
Figure 5:
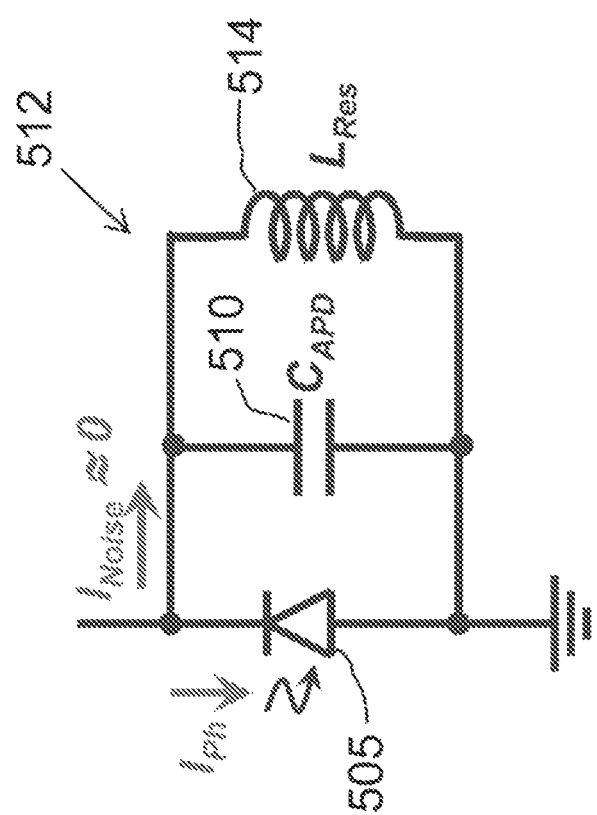
FIG. 5 is a schematic representation of an avalanche photodiode as part of a resonator, in accordance with various embodiments.

In various embodiments, the effect of the parasitic capacitance of the APD can be eliminated and/or compensated by creating a resonance circuit that is adjusted for the frequency of the dynamic biasing signal. FIG. 5 is a schematic representation of an APD 505 as part of a resonator 512. The resonance circuit 512 can be implemented by an external inductor 514 placed in parallel to the parasitic capacitance 510 of APD 505. Herein, by the term parallel, it is meant electrically parallel. External inductor 514 can be a discrete inductor or an integrated inductor. Other techniques can be realized using open- or short-ended strip-lines as the external inductor. Other inductor elements may be used as external inductor 514, depending on the application. Since the frequency of the dynamic bias signal may normally be pre-set, for example, to the data clock frequency, a fixed inductor or strip-line can be used to match the resonance frequency. However, for added flexibility a varactor can be used to electronically fine-tune the resonance frequency. Note that the resonance circuit 512 filters only the injected bias current right where it is created by the APD's parasitic capacitance to reduce the noise current substantially and/or to approximately zero. The resonance circuit 512 minimally affects the photocurrent created by the active region of the APD. These techniques can be applied in addition to any existing solutions to further enhance the performance of dynamic biased APDs.

Figure 6:
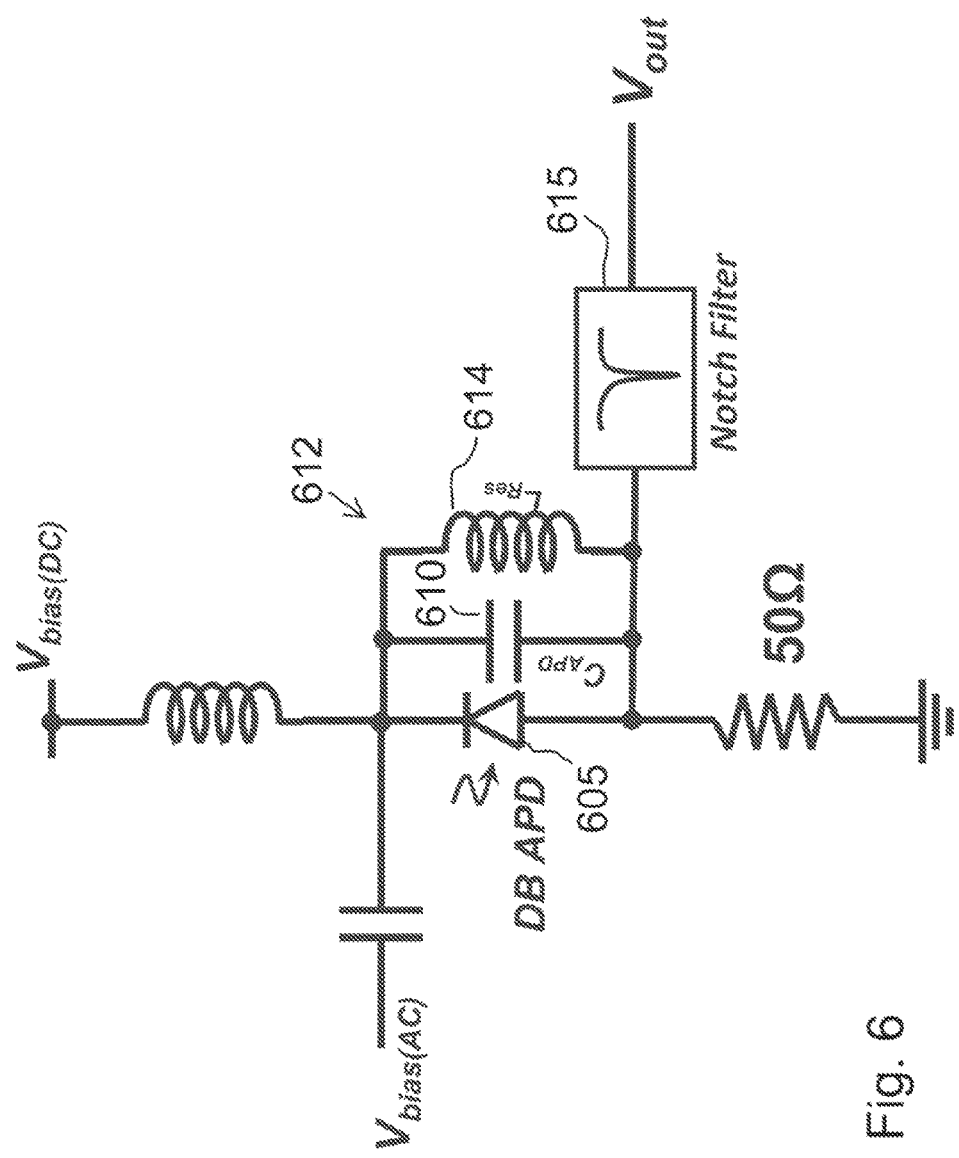
FIG. 6 is a schematic representation of a resonator including an avalanche photodiode implemented with a notch filter, in accordance with various embodiments.

FIG. 6 is a schematic representation of a resonator 612 including an APD 605 implemented with a notch filter 615. The resonance circuit 612 can be implemented by an external inductor 614 placed in parallel to the parasitic capacitance 610 of APD 605. External inductor 614 can be a discrete inductor or an integrated inductor. Other techniques can be realized using open- or short-ended strip-lines as the external inductor. Other inductor elements may be used as external inductor 614, depending on the application. Since the frequency of the dynamic bias signal may normally be pre-set, for example, to the data clock frequency, a fixed inductor or strip-line can be used to match the resonance frequency. However, for added flexibility a varactor can be used to electronically fine-tune the resonance frequency.

With the APD 605 and external inductor 614 in parallel, both are coupled to the same bias sources. With notch filter 615 coupled to the external inductor 614 and APD 605, notch filter 615 can provide a voltage output in response to an optical signal incident on APD 605. Though APD 605 and external inductor 614 are shown as coupled to ground via a 50 ohm resistor, other size resistors may be used depending on the application. Additionally, another reference may be used other than ground. As above, the resonance circuit 612 filters only the injected bias current right where it is created by the APD's parasitic capacitance 610. The resonance circuit 612 minimally affects the photocurrent created by the active region of the APD 605.

Figure 7:
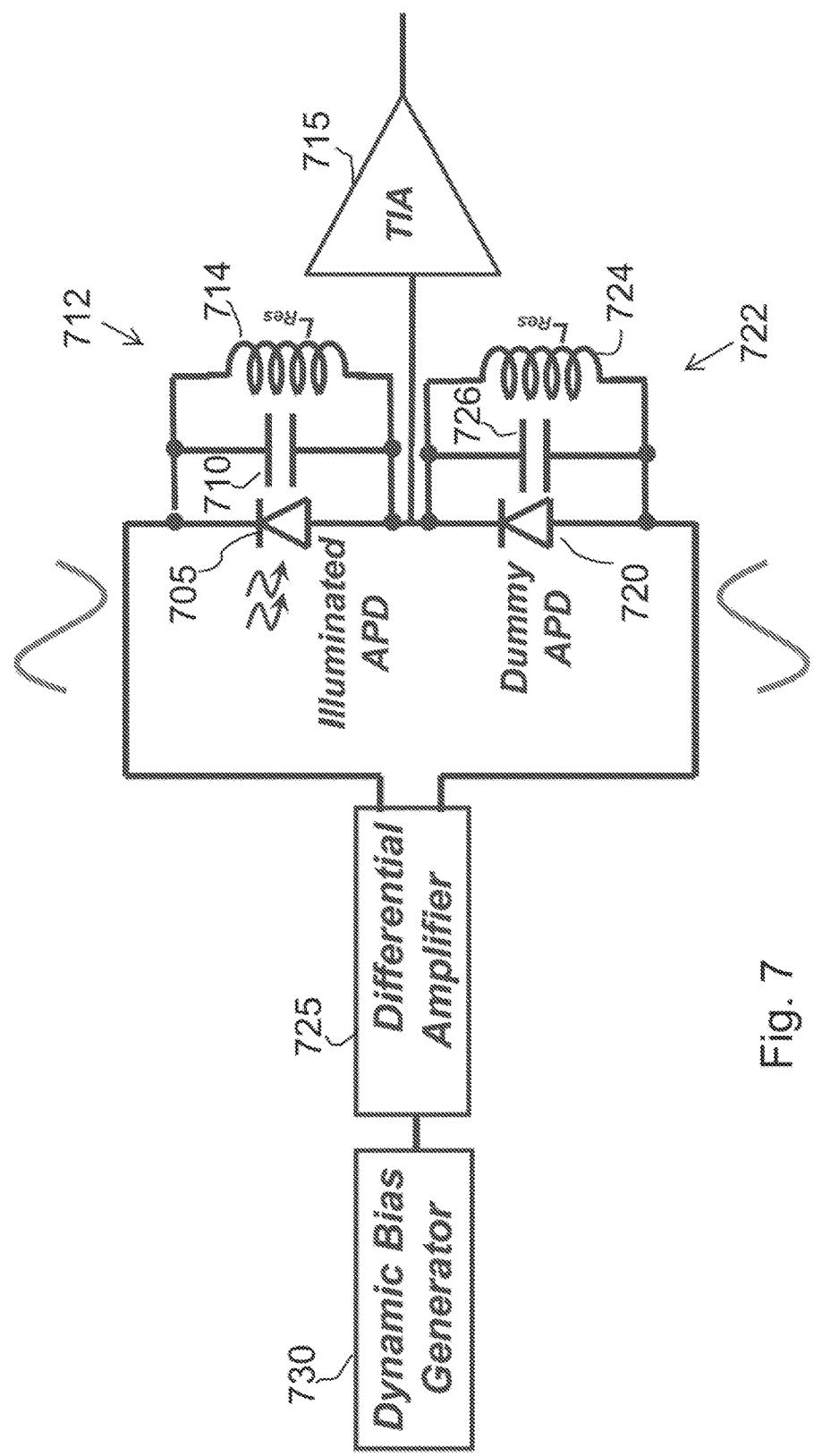
FIG. 7 is a schematic representation of a resonator including an avalanche photodiode implemented with a dummy avalanche photodiode and a differential signaling technique, in accordance with various embodiments.

FIG. 7 is a schematic representation of a resonator 712 including an APD 705 implemented with a dummy APD 720 and a differential signaling technique. The resonance circuit 712 can be implemented by an external inductor 714 placed in parallel to a parasitic capacitance 710 of APD 705. External inductor 714 can be a discrete inductor or an integrated inductor. Other techniques can be realized using open- or short-ended strip-lines as the external inductor. Other inductor elements may be used as external inductor 714, depending on the application. Since the frequency of the dynamic bias signal may normally be pre-set, for example, to the data clock frequency, a fixed inductor or strip-line can be used to match the resonance frequency. However, for added flexibility a varactor can be used to electronically fine-tune the resonance frequency. With the APD 705 and external inductor 714 in parallel, both are coupled to the same bias sources. APD 705 can be arranged in a differential signaling technique with a dummy APD 720 using a transimpedance amplifier 715.

Dummy APD 720 can be implemented in a resonance circuit 722 with an external inductor 724 placed in parallel to parasitic capacitance 726 of APD 720. External inductor 724 can be a discrete inductor or an integrated inductor. Other techniques can be realized using open- or short-ended strip-lines as the external inductor. The inductance value of external inductor 724 may equal or be substantially equal to inductance value of external inductor 714.

A dynamic bias generator 730 can provide a drive signal to a differential amplifier 725 that is coupled to both APD 705 and dummy APD 720. Differential amplifier 725 can be realized as a RF differential amplifier. APD 705 can be coupled to dummy APD 720 at an input to transimpedance amplifier 715, where transimpedance amplifier 715 can provide a voltage output in response to an optical signal incident on APD 705. As above, the resonance circuit 712 filters only the injected bias current right where it is created by the APD's parasitic capacitance. The resonance circuit 712 minimally affects the photocurrent created by the active region of the APD 705.

Figure 8:
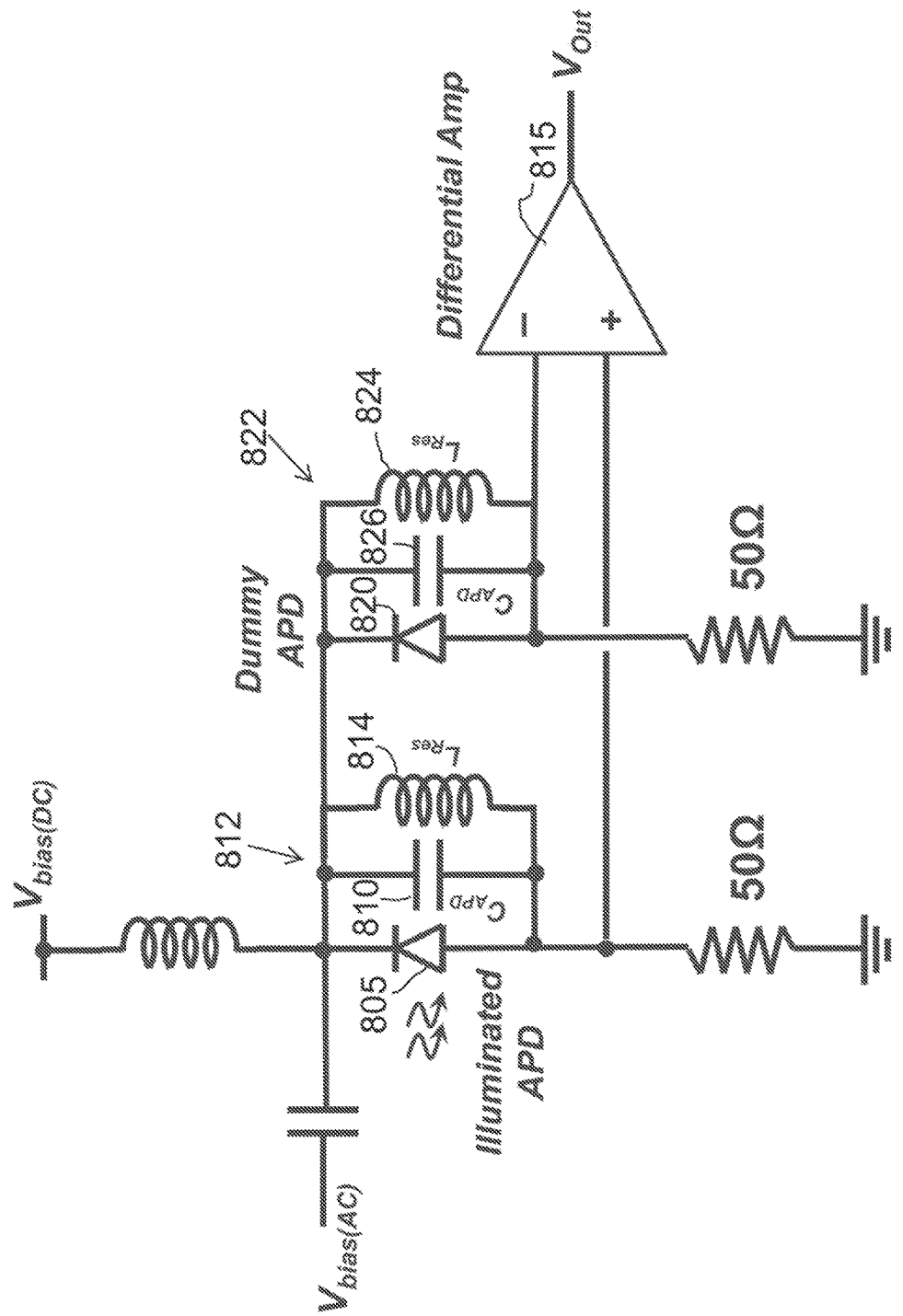
FIG. 8 is a schematic representation of a resonator including an avalanche photodiode implemented with a dummy avalanche photodiode with a differential biasing technique, in accordance with various embodiments.

FIG. 8 is a schematic representation of a resonator 812 including an APD 805 implemented with a dummy APD with a differential biasing technique. The resonance circuit 812 can be implemented by an external inductor 814 placed in parallel to parasitic capacitance 810 of APD 805. External inductor 814 can be a discrete inductor or an integrated inductor. Other techniques can be realized using open- or short-ended strip-lines as the external inductor. Other inductor elements may be used as external inductor 814, depending on the application. Since the frequency of the dynamic bias signal may normally be pre-set, for example, to the data clock frequency, a fixed inductor or strip-line can be used to match the resonance frequency. However, for added flexibility a varactor can be used to electronically fine-tune the resonance frequency.

With the APD 805 and external inductor 814 in parallel, both are coupled to the same bias sources. APD 805 can be arranged in a differential signaling technique with a dummy APD 820 using a differential amplifier 815. Differential amplifier 815 may be realized as an RF differential amplifier. Dummy APD 820 can be implemented in a resonance circuit 822 with an external inductor 824 placed in parallel to parasitic capacitance 826 of APD 820. External inductor 824 can be a discrete inductor or an integrated inductor. Other techniques can be realized using open- or short-ended strip-lines as the external inductor. The inductance value of external inductor 824 may equal or be substantially equal to inductance value of external inductor 814.

Dummy APD 820 can be coupled the same bias sources as APD 805. APD 805 can be coupled to an input to differential amplifier 815 and dummy APD 820 can be coupled to another input to differential amplifier 815. In this arrangement, differential amplifier 815 can provide a voltage output in response to an optical signal incident on APD 805. Though APD 805 and dummy APD 820 are shown as coupled to ground via a 50 ohm resistor, other size resistors may be used depending on the application. Additionally, another reference may be used other than ground. As above, the resonance circuit 812 filters only the injected bias current right where it is created by the APD's parasitic capacitance. The resonance circuit 812 minimally affects the photocurrent created by the active region of the APD 805.

Figure 9:
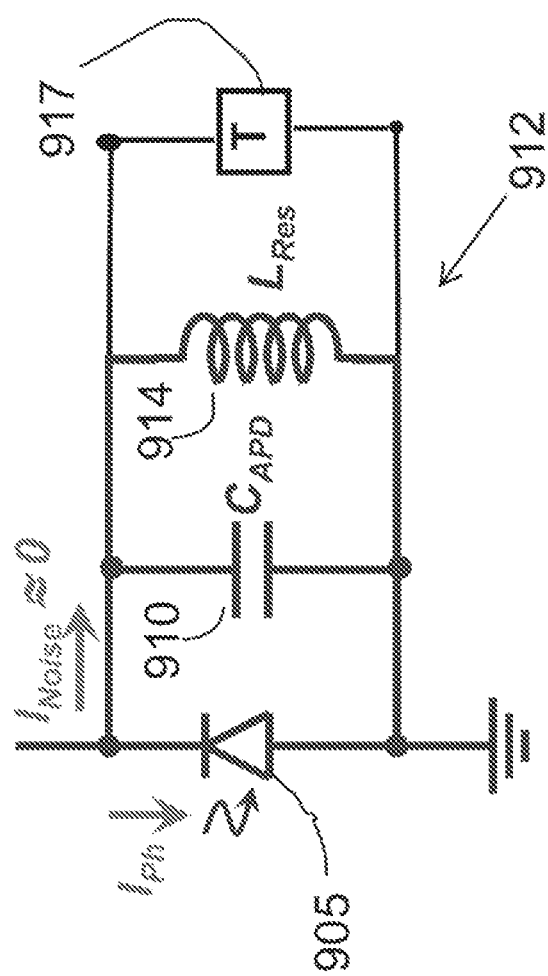
FIG. 9 is a schematic representation of an avalanche photodiode as part of a resonator having a tuning element, in accordance with various embodiments.

FIG. 9 is a schematic representation of an APD 905 as part of a resonator 912 having a tuning element 917. The resonance circuit 912 can be implemented by an external inductor 914 placed in parallel to parasitic capacitance 910 of APD 905. External inductor 914 can be a discrete inductor or an integrated inductor. Other techniques can be realized using open- or short-ended strip-lines as the external inductor. Other inductor elements may be used as external inductor 914, depending on the application. Since the frequency of the dynamic bias signal may normally be pre-set, for example, to the data clock frequency, a fixed inductor or strip-line can be used to match the resonance frequency. Tuning element 917 can be implemented to electronically fine-tune the resonance frequency of resonance circuit 912. Tuning element 917 may be realized by a varactor or other appropriate component. Tuning element 917 may be implemented in arrangements identical or similar to the arrangements of FIGS. 5-8.

Figure 10:
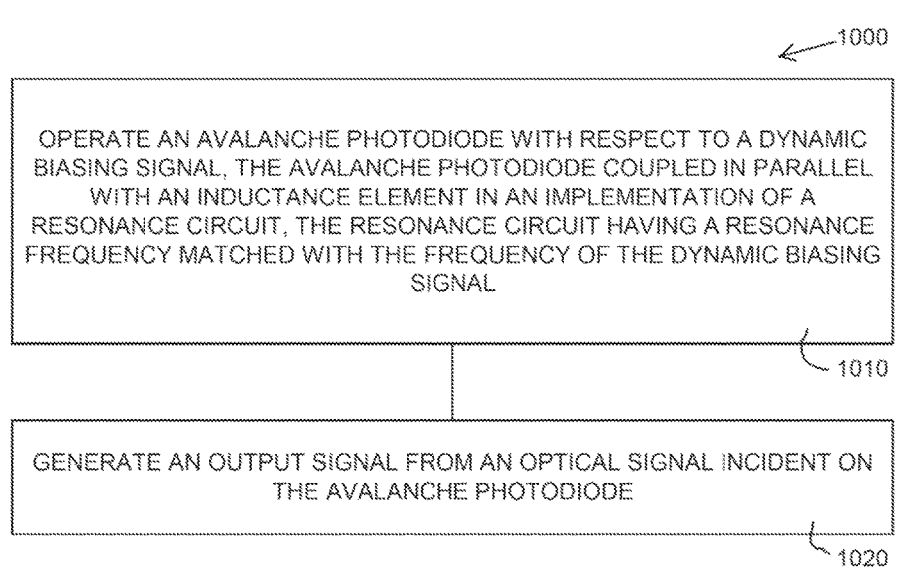
FIG. 10 is a flow diagram of features of an example method of operating an avalanche photodiode, in accordance with various embodiments.

FIG. 10 is a flow diagram of features of an embodiment of an example method 1000 of operating an APD. At 1010, an avalanche photodiode is operated with respect to a dynamic biasing signal, where the avalanche photodiode is coupled in parallel with an inductance element in an implementation of a resonance circuit, in which the resonance circuit has a resonance frequency matched with the frequency of the dynamic biasing signal. The avalanche photodiode can be structured in reverse bias under dynamic biasing, in which the avalanche photodiode is coupled in parallel with an inductance element in an implementation of a resonance circuit with a parasitic capacitance of the avalanche photodiode. At 1020, an output signal is generated from an optical signal incident on the avalanche photodiode.

Method 1000 or similar methods can include applying a noise cancellation technique to improve signal-to-noise ratio of the avalanche photodiode as a receiver in addition to operating the avalanche photodiode in the resonance circuit with the inductance element.

Method 1000 or similar methods can include generating the output signal from the optical signal to include using a notch filter having an output to provide the output signal with an input of the notch filter coupled to the inductance element.

Method 1000 or similar methods can include operating the avalanche photodiode and a dummy avalanche photodiode in a differential signaling arrangement, the inductance element in parallel with the parasitic capacitance being a first inductor coupled to the dummy avalanche photodiode, the dummy avalanche photodiode in parallel with a second inductor, the output signal being provided from a transimpedance amplifier coupled to the avalanche photodiode and the dummy avalanche photodiode.

Method 1000 or similar methods can include operating the avalanche photodiode and a dummy avalanche photodiode in a differential biasing arrangement, the inductance element in parallel with the parasitic capacitance being a first inductor coupled to a dummy avalanche photodiode, the dummy avalanche photodiode in parallel with a second inductor, the dummy avalanche photodiode coupled to an input of a differential amplifier and the avalanche photodiode coupled to another input of the differential amplifier, the differential amplifier having an output to provide the output signal.

Figure 11:
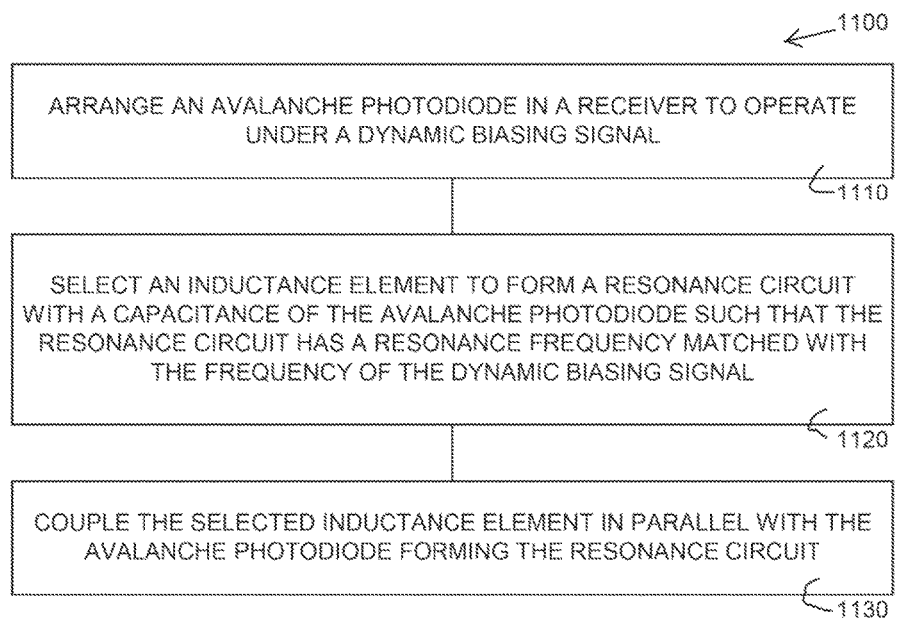
FIG. 11 is a flow diagram of features of an example method of structuring a system with an avalanche photodiode, in accordance with various embodiments.

FIG. 11 is a flow diagram of features of an embodiment of an example method 1100 of structuring a system with an APD. At 1110, an avalanche photodiode is arranged in a receiver to operate under a dynamic biasing signal. At 1120, an inductance element is selected to form a resonance circuit with a parasitic capacitance of the avalanche photodiode such that the resonance circuit has a resonance frequency matched with the frequency of the dynamic biasing signal. The frequency matching can be performed to block and/or compensate for current injection associated with the parasitic capacitance of the avalanche photodiode. At 1130, the selected inductance element is coupled in parallel with the avalanche photodiode forming the resonance circuit. Standard processing techniques can be used to fabricate and arrange an avalanche photodiode with an inductance element in various arrangements as taught herein.

Method 1100 or similar methods can include the selected inductance element being a discrete inductor. Other realizations of an inductance element may be used, such as but not limited to, an integrated inductor, open- or short-ended strip-lines, or combinations of inductance elements.

Method 1100 or similar methods can include coupling the inductance element to a notch filter and arranging an output of the notch filter to operatively provide an output signal in response to an optical signal incident on the avalanche photodiode.

Method 1100 or similar methods can include disposing the avalanche photodiode with a dummy avalanche photodiode in a differential signaling arrangement; coupling the inductance element in parallel with the parasitic capacitance as a first inductor coupled to the dummy avalanche photodiode; coupling a second inductor in parallel with the dummy avalanche photodiode; and coupling the avalanche photodiode and the dummy avalanche photodiode to a transimpedance amplifier, the transimpedance amplifier to operatively provide an output signal in response to an optical signal incident on the avalanche photodiode.

Method 1100 or similar methods can include disposing the avalanche photodiode and a dummy avalanche photodiode in a differential biasing arrangement; coupling the inductance element in parallel with the parasitic capacitance as a first inductor coupled to a dummy avalanche photodiode; coupling a second inductor in parallel with the dummy avalanche photodiode; and coupling the dummy avalanche photodiode coupled to an input of a differential amplifier and coupling the avalanche photodiode to another input of the differential amplifier, the differential amplifier having an output to operatively provide an output signal in response to an optical signal incident on the avalanche photodiode.

Figure 12:
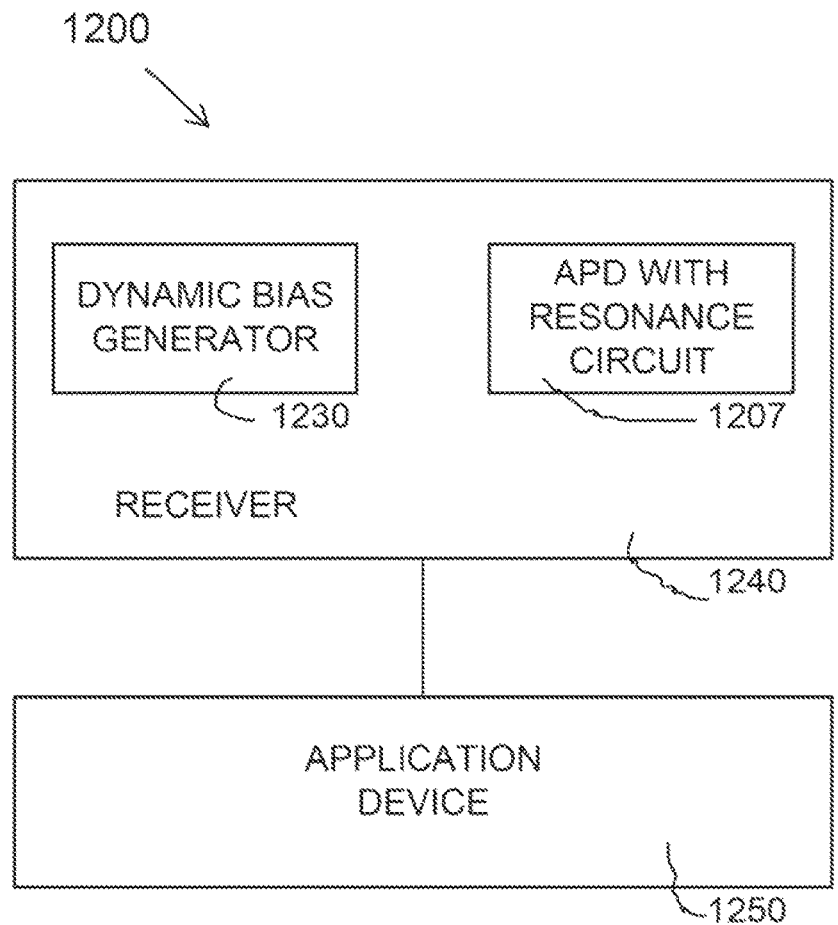
FIG. 12 is a block diagram of an example system having an avalanche photodiode structured with an inductance element, in accordance with various embodiments.

FIG. 12 is a block diagram of an embodiment of an example system 1200 having an avalanche photodiode structured with an inductance element arranged to provide an output signal in response to an optical signal incident on the avalanche photodiode. The avalanche photodiode arranged with an inductance element may be configured in an arrangement or combination of features of the arrangements as taught in one or more of FIGS. 5-11. System 1200 can comprise an avalanche photodiode arranged to operate in reverse bias under dynamic biasing with respect to a dynamic biasing signal, the dynamic biasing signal having a frequency of operation; and an inductance element coupled in parallel with the avalanche photodiode in an implementation of a resonance circuit with a parasitic capacitance of the avalanche photodiode, the resonance circuit having a resonance frequency matched with the frequency of the dynamic biasing signal. For instance, system 1200 can include a receiver 1240 arranged to provide an output signal to an application device 1250 from an optical signal received in system 1200. The format of application device 1250 depends on the functions of system 1200. Receiver 1240 can include a dynamic bias generator 1230 and an APD structured with a resonance circuit 1207 as taught herein.

System 1200 can be structured in a number of different formats. System 1200 may be realized as a system on a chip. System 1200 may be structured as a set of integrated circuits with an inductance element of the APD structured with a resonance circuit 1207 external to the chip containing the APD of the resonance circuit. System 1200 may be structured with the application device 1250 being components to provide the output signal in response to the optical signal received in system 1200. System 1200 may be structured with distributed components.

System 1200 or systems similar to system 1200 can include the resonance circuit implemented with the inductance element being a discrete inductor in parallel with the avalanche photodiode. System 1200, or systems similar to system 1200, can include the resonance circuit implemented with the inductance element being an open-ended strip-line or short-ended strip-line. System 1200, or systems similar to system 1200, can include a varactor disposed in the resonance circuit to electronically fine-tune the resonance frequency.

System 1200, or systems similar to system 1200, can include the inductance element coupled to an input of a notch filter, the notch filter having an output to provide an output signal from an optical signal incident on the avalanche photodiode.

System 1200, or systems similar to system 1200, can include the inductance element in parallel with the parasitic capacitance being a first inductor coupled to a dummy avalanche photodiode, the dummy avalanche photodiode in parallel with a second inductor, with the avalanche photodiode and the dummy avalanche photodiode in a differential signaling arrangement. In a differential signaling arrangement, system 1200 or systems similar to system 1200 can comprise a differential amplifier coupled to an end of the avalanche photodiode opposite coupling of the avalanche photodiode to the dummy avalanche photodiode and coupled to an end of the dummy avalanche photodiode opposite coupling of the dummy avalanche photodiode to the avalanche photodiode; a dynamic bias generator coupled to the differential amplifier to provide input to the differential amplifier; and a transimpedance amplifier having an input coupled to the avalanche photodiode and the dummy avalanche photodiode and having an output to provide an output signal from an optical signal incident on the avalanche photodiode. The differential amplifier can be realized as a radio frequency differential amplifier. Inductance value of the first inductor may equal inductance value of the second inductor.

System 1200, or systems similar to system 1200, can include the inductance element in parallel with the parasitic capacitance being a first inductor coupled to a dummy avalanche photodiode, the dummy avalanche photodiode in parallel with a second inductor, with the avalanche photodiode and the dummy avalanche photodiode in a differential biasing arrangement. In a differential biasing arrangement, system 1200 or systems similar to system 1200 can include the avalanche photodiode and the dummy avalanche photodiode coupled to receive the same bias signal the dummy avalanche photodiode coupled to an input of a differential amplifier and the avalanche photodiode coupled to another input of the differential amplifier, the differential amplifier having an output to provide an output signal from an optical signal incident on the avalanche photodiode. The differential amplifier can be realized as a radio frequency differential amplifier. Inductance value of the first inductor equals inductance value of the second inductor.

In various embodiments, a new method for blocking and/or compensating the problem of current injection associated with the parasitic capacitance of APDs operated under dynamic biasing may be realized by implementing a resonance circuit whose resonance frequency is matched with the frequency of the dynamic biasing signal. The resonance circuit can be implemented using a discrete inductor in parallel with the APD or any other circuit techniques, such as open- or short-ended strip-lines. For added flexibility, a varactor may be used in the resonance circuit to electronically fine-tune the resonance frequency. Such methods can also be applied to any other noise cancellation methods used for improving signal-to-noise ratio of APD receivers.

Although specific embodiments have been illustrated and described herein, it will be appreciated by those of ordinary skill in the art that any arrangement that is calculated to achieve the same purpose may be substituted for the specific embodiments shown. Upon studying the disclosure, it will be apparent to those skilled in the art that various modifications and variations can be made in the devices and methods of various embodiments of the invention. Various embodiments can use permutations and/or combinations of embodiments described herein. Other embodiments will be apparent to those skilled in the art from consideration of the specification and practice of the embodiments disclosed herein. It is to be understood that the above description is intended to be illustrative, and not restrictive, and that the phraseology or terminology employed herein is for the purpose of description.

What is claimed is:

1. A system comprising:
   a bias source arranged to generate a dynamic biasing signal, the dynamic biasing signal being a non-constant signal having a non-zero frequency of operation;
   an avalanche photodiode arranged with the bias source to operate in reverse bias under dynamic biasing based on the dynamic biasing signal;
   an inductance element coupled in parallel with the avalanche photodiode at two nodes, the inductance element and the avalanche photodiode both individually share the two nodes in common as connection points, the inductance element and the avalanche photodiode structured as part of a resonance circuit with a parasitic capacitance of the avalanche photodiode, the resonance circuit having components to provide a resonance frequency matched with the frequency of the dynamic biasing signal.

2. The system of claim 1, wherein the resonance circuit is implemented with the inductance element being a discrete inductor in parallel with the avalanche photodiode.

3. The system of claim 1, wherein the resonance circuit is implemented with the inductance element being an open-ended strip-line or short-ended strip line.

4. The system of claim 1, wherein a varactor is disposed in the resonance circuit to electronically fine-tune the resonance frequency.

5. The system of claim 1, wherein the inductance element is coupled to an input of a notch filter, the notch filter having an output to provide an output signal from an optical signal incident on the avalanche photodiode.

6. The system of claim 1, wherein the inductance element in parallel with the parasitic capacitance is a first inductor coupled to a dummy avalanche photodiode, the dummy avalanche photodiode in parallel with a second inductor, with the avalanche photodiode and the dummy avalanche photodiode in a differential signaling arrangement.

7. The system of claim 6, wherein the system comprises:
a differential amplifier coupled to an end of the avalanche photodiode opposite coupling of the avalanche photodiode to the dummy avalanche photodiode and coupled to an end of the dummy avalanche photodiode opposite coupling of the dummy avalanche photodiode to the avalanche photodiode;
a dynamic bias generator coupled to the differential amplifier to provide input to the differential amplifier; and
a transimpedance amplifier having an input coupled to the avalanche photodiode and the dummy avalanche photodiode and having an output to provide an output signal from an optical signal incident on the avalanche photodiode.

8. The system of claim 7, wherein the differential amplifier is a radio frequency differential amplifier.

9. The system of claim 7, wherein inductance value of the first inductor equals inductance value of the second inductor.

10. The system of claim 1, wherein the inductance element in parallel with the parasitic capacitance is a first inductor coupled to a dummy avalanche photodiode, the dummy avalanche photodiode in parallel with a second inductor, with the avalanche photodiode and the dummy avalanche photodiode in a differential biasing arrangement.

11. The system of claim 10, wherein the avalanche photodiode and the dummy avalanche photodiode are coupled to receive the same bias signal, the dummy avalanche photodiode coupled to an input of a differential amplifier and the avalanche photodiode coupled to another input of the differential amplifier, the differential amplifier having an output to provide an output signal from an optical signal incident on the avalanche photodiode.

12. The system of claim 11, wherein the differential amplifier is a radio frequency differential amplifier.

13. The system of claim 11, wherein inductance value of the first inductor equals inductance value of the second inductor.

14. The system of claim 1, wherein the inductance element includes a variable inductance element.

15. A method comprising
operating an avalanche photodiode structured in reverse bias under dynamic biasing with respect to a dynamic biasing signal, the dynamic biasing signal being a non-constant signal having a non-zero frequency of operation, the avalanche photodiode coupled in parallel with an inductance element at two nodes, the inductance element and the avalanche photodiode both individually sharing the two nodes in common as connection points, the inductance element and the avalanche photodiode structured as part of a resonance circuit with a parasitic capacitance of the avalanche photodiode, the resonance circuit having a resonance frequency matched with the frequency of the dynamic biasing signal; and
generating an output signal from an optical signal incident on the avalanche photodiode.

16. The method of claim 15, where the method includes applying a noise cancellation technique to improve signal-to-noise ratio of the avalanche photodiode as a receiver in addition to operating the avalanche photodiode in the resonance circuit with the inductance element.

17. The method of claim 15, wherein generating the output signal from the optical signal includes using a notch filter having an output to provide the output signal with an input of the notch filter coupled to the inductance element.

18. The method of claim 15, wherein the method includes operating the avalanche photodiode and a dummy avalanche photodiode in a differential signaling arrangement, the inductance element in parallel with the parasitic capacitance being a first inductor coupled to the dummy avalanche photodiode, the dummy avalanche photodiode in parallel with a second inductor, the output signal being provided from a transimpedance amplifier coupled to the avalanche photodiode and the dummy avalanche photodiode.

19. The method of claim 15, wherein the method includes operating the avalanche photodiode and a dummy avalanche photodiode in a differential biasing arrangement, the inductance element in parallel with the parasitic capacitance being a first inductor coupled to a dummy avalanche photodiode, the dummy avalanche photodiode in parallel with a second inductor, the dummy avalanche photodiode coupled to an input of a differential amplifier and the avalanche photodiode coupled to another input of the differential amplifier, the differential amplifier having an output to provide the output signal.

20. A method comprising:
arranging an avalanche photodiode in a receiver to operate under a dynamic biasing signal, the dynamic biasing signal being a non-constant signal having a non-zero frequency of operation;
selecting an inductance element to form a resonance circuit with a parasitic capacitance of the avalanche photodiode such that the resonance circuit has a resonance frequency matched with the frequency of the dynamic biasing signal to block and/or compensate for current injection associated with the parasitic capacitance of the avalanche photodiode; and
coupling the selected inductance element in parallel with the avalanche photodiode at two nodes, the inductance element and the avalanche photodiode both individually share the two nodes in common as connection points, the inductance element and the avalanche photodiode structured as part of the resonance circuit.

21. The method of claim 20, wherein the selected inductance element is a discrete inductor.

22. The method of claim 20, wherein the method includes coupling the inductance element to a notch filter and arranging an output of the notch filter to operatively provide an output signal in response to an optical signal incident on the avalanche photodiode.

23. The method of claim 20, wherein the method includes:
disposing the avalanche photodiode with a dummy avalanche photodiode in a differential signaling arrangement;
coupling the inductance element in parallel with the parasitic capacitance as a first inductor coupled to the dummy avalanche photodiode;
coupling a second inductor in parallel with the dummy avalanche photodiode; and
coupling the avalanche photodiode and the dummy avalanche photodiode to a transimpedance amplifier, the transimpedance amplifier to operatively provide an output signal in response to an optical signal incident on the avalanche photodiode.

24. The method of claim 20, wherein the method includes:

disposing the avalanche photodiode and a dummy avalanche photodiode in a differential biasing arrangement;

coupling the inductance element in parallel with the parasitic capacitance as a first inductor coupled to a dummy avalanche photodiode;

coupling a second inductor in parallel with the dummy avalanche photodiode; and coupling the dummy avalanche photodiode coupled to an input of a differential amplifier and coupling the avalanche photodiode to another input of the differential amplifier, the differential amplifier having an output to operatively provide an output signal in response to an optical signal incident on the avalanche photodiode.

* * * * *

UNITED STATES PATENT AND TRADEMARK OFFICE
CERTIFICATE OF CORRECTION

PATENT NO. : 10,128,398 B1
APPLICATION NO. : 14/720249
DATED : November 13, 2018
INVENTOR(S) : Hayat et al.

It is certified that error appears in the above-identified patent and that said Letters Patent is hereby corrected as shown below:

On the Title Page

In Column 2, item (56) under "Foreign Patent Documents", Line 2, delete "10/2003" and insert --8/1999-- therefor On page 2, in Column 1, item (56) under "Other Publications", Line 12, after "pgs.", insert --¶"U.S. Appl. No. 15/148,873, Non Final Office Action dated Jul. 27, 2016", 8 pgs.--

On page 2, in Column 1, item (56) under "Other Publications", Lines 17-18, delete "in AS/In 0.15 Ga 0.85 As" and insert --InAs/In$_{0.15}$Ga$_{0.85}$As-- therefor On page 2, in Column 1, item (56) under "Other Publications", Line 20, delete "in As/In 0.15 Ga 0.85 As" and insert --InAs/In$_{0.15}$Ga$_{0.85}$As-- therefor On page 2, in Column 2, item (56) under "Other Publications", Line 10, delete "In0.52Al0.48As"," and insert --In$_{0.52}$Al$_{0.48}$As",-- therefor On page 2, in Column 2, item (56) under "Other Publications", Line 21, delete "Arrary"," and insert --Array",-- therefor On page 2, in Column 2, item (56) under "Other Publications", Line 32, delete "Quan-Dot" and insert --Quantum-Dot-- therefor On page 2, in Column 2, item (56) under "Other Publications", Line 62, delete "InGaAs/InA1As" and insert --InGaAs/InAlAs-- therefor On page 3, in Column 1, item (56) under "Other Publications", Line 2, delete "um" and insert --µm-- therefor On page 3, in Column 1, item (56) under "Other Publications", Line 24, delete "0.1.um" and insert Signed and Sealed this
Twenty-first Day of April, 2020

Andrei Iancu
*Director of the United States Patent and Trademark Office*

CERTIFICATE OF CORRECTION (continued)
U.S. Pat. No. 10,128,398 B1

--0.1 μm-- therefor

On page 3, in Column 1, item (56) under "Other Publications", Line 28, delete "InAlAs-APD" and insert --InAlAs-APD-- therefor On page 3, in Column 1, item (56) under "Other Publications", Line 30, delete "Ng J. S., et al.," and insert --Ng, J. S., et al.,-- therefor On page 3, in Column 1, item (56) under "Other Publications", Line 36, delete "In0.53Ga0.47As" and insert --$In_{0.53}Ga_{0.47}As$-- therefor On page 3, in Column 1, item (56) under "Other Publications", Line 42, delete "Ga0.18In0.18In0.82As0.39P0.61"," and insert --$Ga_{0.18}In_{0.18}In_{0.82}As_{0.39}P_{0.61}$",-- therefor On page 3, in Column 1, item (56) under "Other Publications", Line 45, delete "Ga0.33In0.67As0.70P0.30"," and insert --$Ga_{0.33}In_{0.67}As_{0.70}P_{0.30}$",-- therefor On page 3, in Column 2, item (56) under "Other Publications", Line 31, delete "In0.38Ga0.52P p+in+diodes"," and insert --$In_{0.38}Ga_{0.52}P$ $p^+in^+$ diodes",-- therefor On page 3, in Column 2, item (56) under "Other Publications", Line 41, delete "Nosie" and insert --Noise-- therefor In the Claims In Column 9, Line 51, in Claim 15, after "comprising", insert --:--